United States Patent
Hwang et al.

(10) Patent No.: US 7,626,218 B2
(45) Date of Patent: Dec. 1, 2009

(54) MONOLITHIC INTEGRATED CIRCUIT HAVING ENHANCEMENT MODE/DEPLETION MODE FIELD EFFECT TRANSISTORS AND RF/RF/MICROWAVE/MILLI-METER WAVE MILLI-METER WAVE FIELD EFFECT TRANSISTORS

(75) Inventors: Kiuchul Hwang, Amherst, NH (US); Michael G Adlerstein, Wellesley, MA (US)

(73) Assignee: Raytheon Company, Waltham, MA (US)

( * ) Notice: Subject to any disclaimer, the term of this patent is extended or adjusted under 35 U.S.C. 154(b) by 180 days.

(21) Appl. No.: 11/051,816

(22) Filed: Feb. 4, 2005

(65) Prior Publication Data
US 2006/0175632 A1    Aug. 10, 2006

(51) Int. Cl.
H01L 29/201    (2006.01)
H01L 29/778    (2006.01)

(52) U.S. Cl. ............................. 257/195; 257/E21.407; 257/E27.061

(58) Field of Classification Search .................. 257/192, 257/220, E27.061, 194, 195, 268, 275, E21.403, 257/E21.407, E32.697, E27.012, E27.068
See application file for complete search history.

(56) References Cited

U.S. PATENT DOCUMENTS

| | | | |
|---|---|---|---|
| 4,963,501 A * | 10/1990 | Ryan et al. ................. | 438/183 |
| 5,104,825 A | 4/1992 | Takikawa | |
| 5,578,512 A | 11/1996 | Tao | |
| 5,686,741 A | 11/1997 | Ohori et al. | |
| 6,274,893 B1 | 8/2001 | Igarashi et al. | |
| 6,670,652 B2 | 12/2003 | Song | |
| 6,703,638 B2 * | 3/2004 | Danzilio ................. | 257/12 |
| 7,183,592 B2 | 2/2007 | Hwang | |
| 7,321,132 B2 * | 1/2008 | Robinson et al. ............. | 257/12 |
| 7,488,992 B2 * | 2/2009 | Robinson ................... | 257/130 |
| 2002/0177261 A1 | 11/2002 | Song | |
| 2004/0188724 A1 | 9/2004 | Ishida et al. | |
| 2005/0139868 A1 | 6/2005 | Anda | |
| 2005/0263789 A1 | 12/2005 | Hwang | |

FOREIGN PATENT DOCUMENTS

| | | |
|---|---|---|
| DE | 198 27 901 A1 | 1/1999 |
| DE | 19827901 | 1/1999 |
| EP | 1 261 035 A2 | 11/2002 |
| EP | 1 261 035 A3 | 11/2002 |
| JP | 11-040578 | 1/1999 |

OTHER PUBLICATIONS

PCT/US2006/002040 International Search Report dated May 18, 2006.
Ellen Lan et al., "A Field Plate Device by Self-Aligned Spacer Process", Motorola Inc., Microwave and Mixed Signal Technologies Lab, Tempe, AZ, 4 pgs. The International Conference on Compound Semiconductor Manufacturing Technology, 2004.
PCT/US2005/017710 International Search Report dated Dec. 12, 2005.

* cited by examiner

Primary Examiner—Lynne A. Gurley
Assistant Examiner—Colleen A Matthews
(74) Attorney, Agent, or Firm—Daly, Crowley, Mofford & Durkee, LLP

(57) ABSTRACT

A semiconductor structure having: a III-V substrate structure; an enhancement mode transistor device disposed in a first region of the structure; a depletion mode transistor device disposed in a laterally displaced second region of the structure; and a RF/microwave/milli-meter wave transistor device formed in a laterally displaced third region thereof.

11 Claims, 6 Drawing Sheets

MONOLITHIC INTEGRATED CIRCUIT HAVING ENHANCEMENT MODE/DEPLETION MODE FIELD EFFECT TRANSISTORS AND RF/RF/MICROWAVE/MILLI-METER WAVE MILLI-METER WAVE FIELD EFFECT TRANSISTORS

TECHNICAL FIELD

This invention relates to monolithic integrated circuits having enhancement mode/depletion mode field effect transistors (FETs) and RF/microwave/milli-meter wave FETS.

BACKGROUND

As is known in the art, GaAs PHEMT's have exhibited superior low-noise and power performance compared to GaAs MESFET's for application to RF/microwave/milli-meter wave/millimeter-wave frequencies. This advantage has been achieved by bandgap engineering of GaAs, AlGaAs and InGaAs materials. Typically, depletion mode pHEMT transistors (which have a negative gate-source turn on voltage) are used in to amplify signals at RF/microwave/milli-meter wave frequencies. In some applications it is desirable to integrate digital functions on the monolithic circuits which incorporate high performance depletion mode rf transistors. For this, enhancement (E) mode transistors are used together with depletion (D) mode transistors to give the smallest circuits with the lowest power consumption and higher functionality for mixed mode applications. Enhancement mode transistors have a positive gate-source threshold voltage. It is difficult to introduce another material layer structure to implement the enhancement (E) mode PHEMT for monolithic integration of digital logic and RF circuits for mixed mode signal applications without disturbing the rf performance of the depletion mode PHEMT device.

SUMMARY

In accordance with the present invention, a semiconductor structure is provided having: a III-V substrate structure; an enhancement mode transistor device disposed in a first region of the structure; a depletion mode transistor device disposed in a laterally displaced second region of the structure; and a RF/microwave/milli-meter wave transistor device formed in a laterally displaced third region thereof.

In one embodiment, the semiconductor structure includes a common channel layer for the depletion mode and enhancement mode transistor devices.

In one embodiment, the semiconductor structure includes: a III-V substrate structure; an InGaAs layer disposed over the substrate structure; an AlGaAs layer disposed on the InGaAs layer; an InGaP layer disposed on the AlGaAs layer; an AlGaAs Schottky layer disposed on the InGaP layer; and a gate electrode in Schottky contact with the an AlGaAs Schottky layer. The enhancement mode transistor device has a gate electrode thereof in Schottky with the InGaP layer. The depletion mode transistor device has a gate electrode thereof in Schottky contact with the AlGaAs Schottky layer. The RF/microwave/milli-meter wave transistor device has a gate electrode thereof in Schottky contact with the AlGaAs Schottky layer.

In one embodiment, a semiconductor structure is provided having a III-V substrate structure with an enhancement mode transistor device disposed in a first region of the structure and depletion mode transistor device disposed in a laterally displaced second region of the structure and a RF/microwave/milli-meter wave transistor device formed in a laterally displaced third region thereof. The structure has a channel layer for the depletion mode and enhancement mode transistor devices. The structure includes: an enhancement mode transistor device InGaP etch stop/Schottky contact layer disposed over the channel layer; a first layer disposed on the InGaP layer; a depletion mode transistor device etch stop layer disposed on the first layer; and a second layer disposed on the depletion mode transistor device etch stop layer. The depletion mode transistor device has a gate recess passing through the second layer and the depletion mode transistor device etch-stop layer. The enhancement mode transistor device has a gate recess passing through the second layer, the depletion mode transistor device etch stop layer, the first layer, and terminating in the InGaP layer. The material of the first layer is different from InGaP. The RF/microwave/milli-meter wave transistor has a gate recess passing through the second layer and the depletion mode transistor device etch stop layer and terminating on the first layer.

As described in the above referenced patent application Ser. No. 10/854,705 filed May 26, 2004, PHEMTs for RF/microwave/milli-meter wave applications have depletion mode gates formed on AlGaAs, and this improvement has the same depletion gates formed on AlGaAs with the same kind of RF/microwave/milli-meter wave performances. Besides that, the introduction of the epitaxial layers for enhancement mode PHEMTs has been found by the inventors to not adversely affect the performance of RF/microwave/milli-meter wave because the InGaP etch stop/Schottky contact layer is embedded between the AlGaAs layers. Actually, the introduction of the InGaP etch stop/Schottky contact layer has been found by the inventors to add a positive impact to the RF/microwave/milli-meter wave performance because the breakdown voltage of the depletion mode PHEMT with the InGaP etch stop/Schottky contact layer is higher than that of the typical PHEMTs having AlGaAs layer. This higher breakdown voltage can be "traded off" to obtain a beneficial combination of operating current and operating voltage for the RF/microwave/milli-meter wave device.

The details of one or more embodiments of the invention are set forth in the accompanying drawings and the description below. Other features, objects, and advantages of the invention will be apparent from the description and drawings, and from the claims.

DESCRIPTION OF DRAWINGS

Like reference symbols in the various drawings indicate like elements.

DETAILED DESCRIPTION

Figure 1:
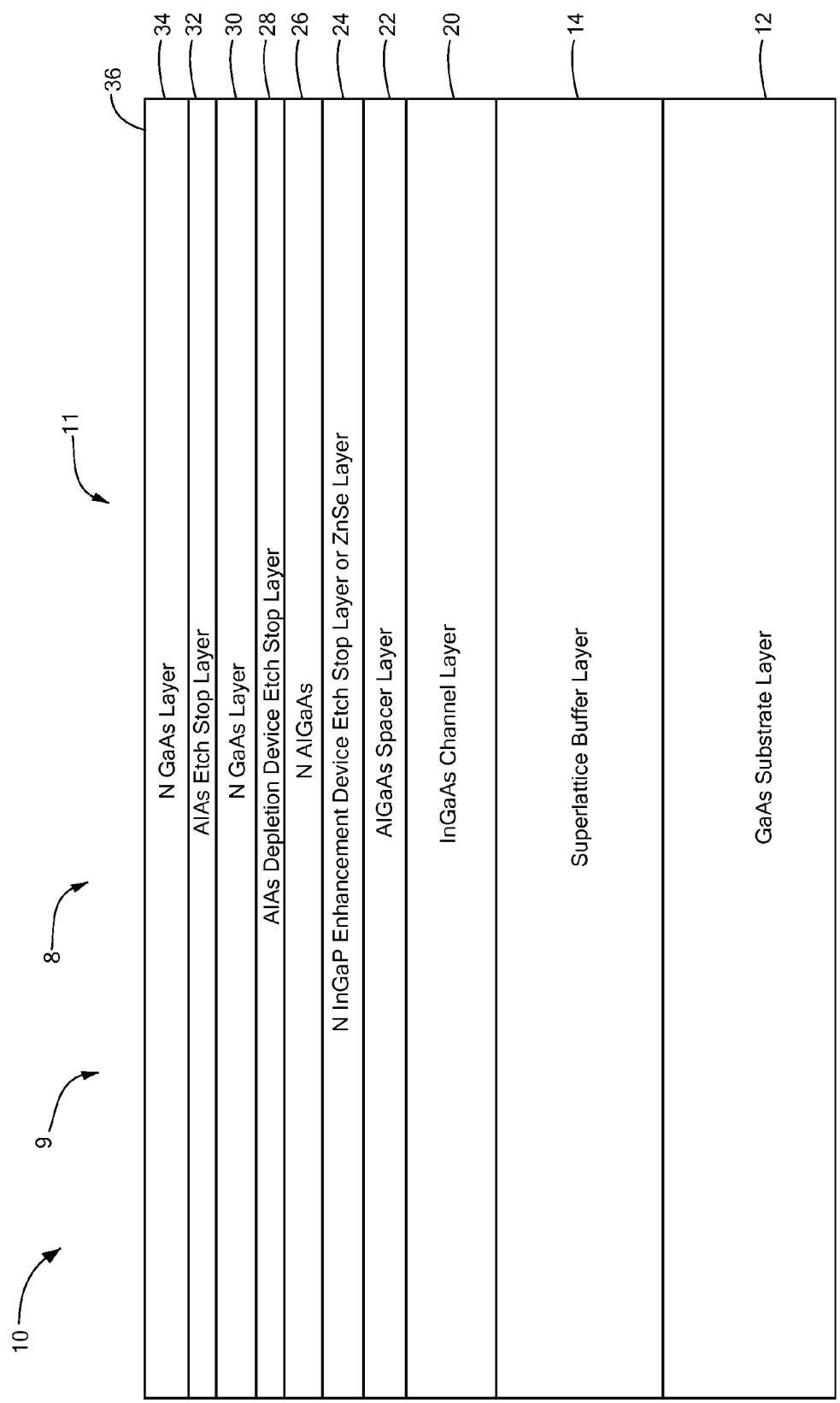
FIGS. 1 through 6 are cross sectional sketches of a semiconductor structure at various stages in fabrication of an enhancement mode field effect transistor, a depletion mode field effect transistor and a RF/microwave/milli-meter wave field effect transistor according to the invention, FIG. 6 showing the enhancement mode field effect transistor, the depletion mode field effect transistor and the RF/microwave/milli-meter wave field effect transistor.
Figure 2:
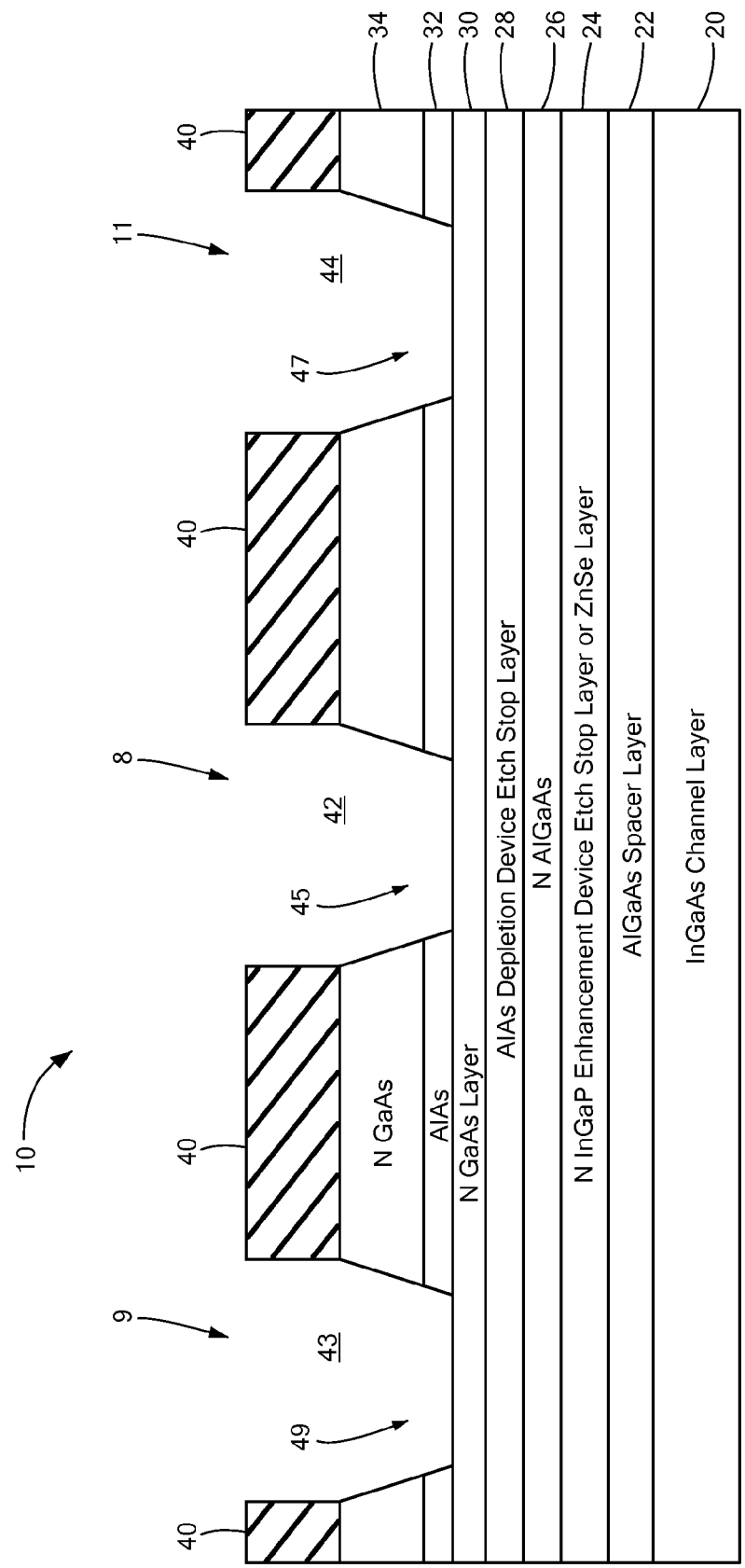
Figure 3:
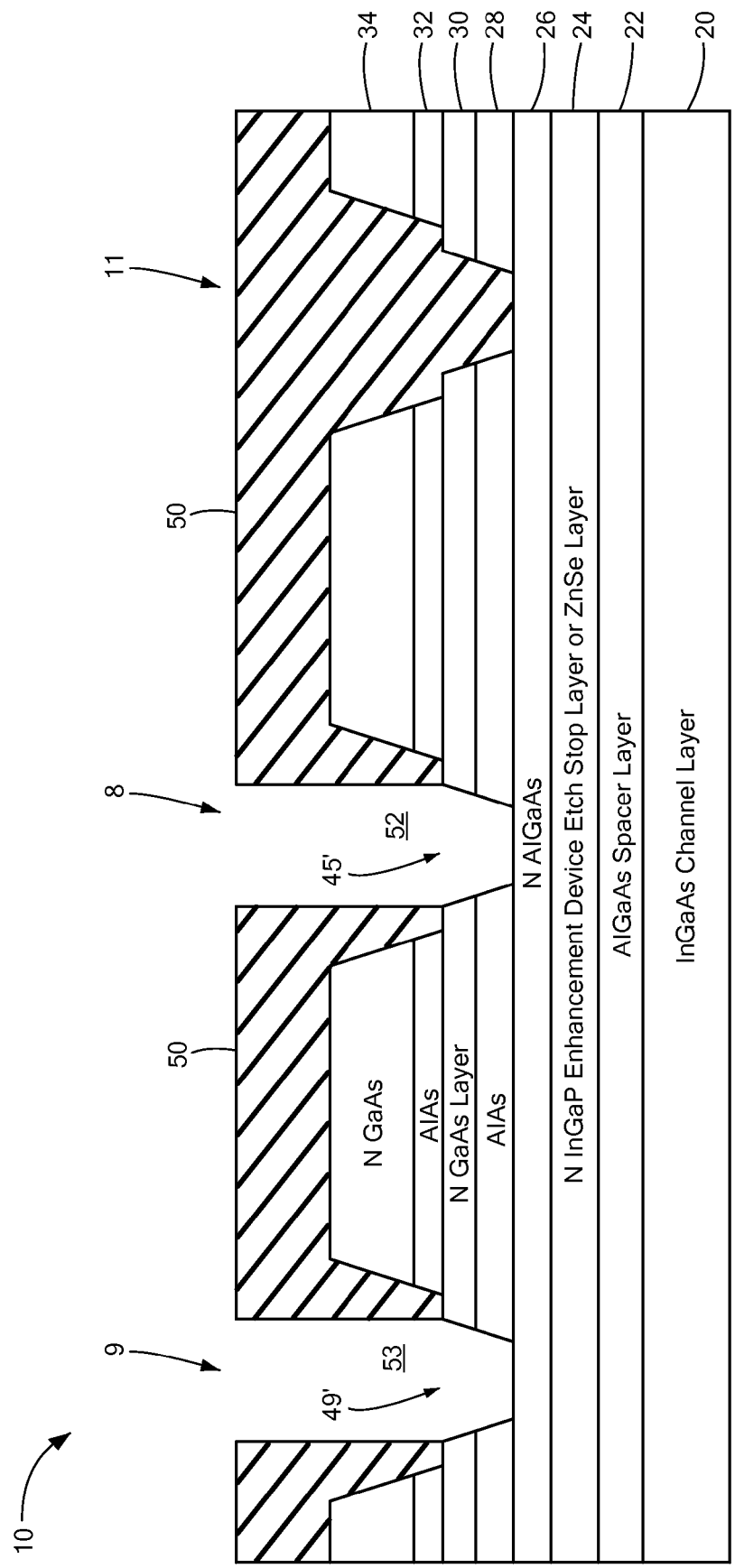
Figure 4:
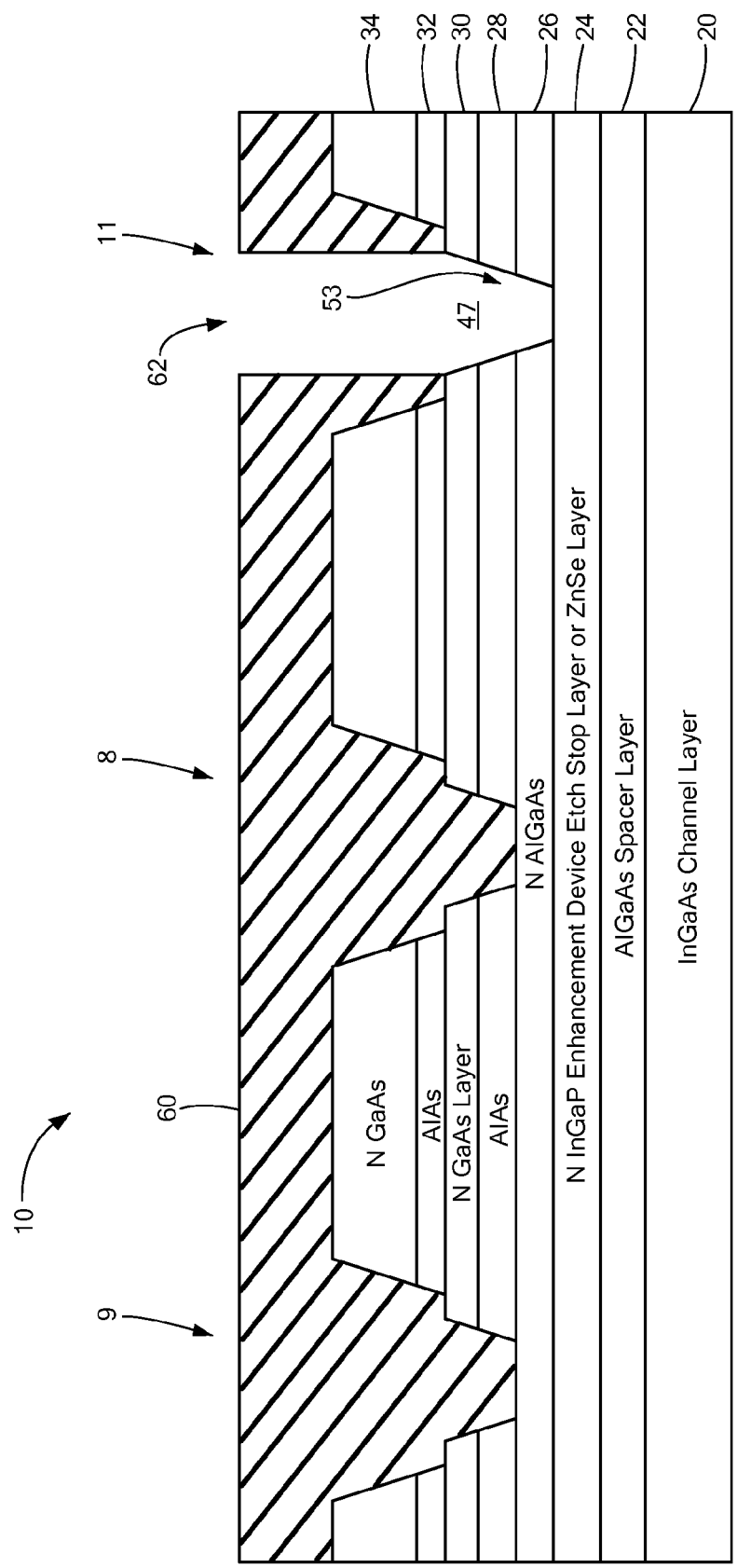

Referring now to FIG. 1, semiconductor structure 10 is shown having a substrate 12, here comprised of semi-insulating III-V, here gallium arsenide (GaAs) or other suitable semiconductor material, is shown having a plurality of layers disposed thereon. As will be described, a depletion mode transistor device is disposed in a first region 8 of the structure 10 and an enhancement mode transistor device is disposed in a laterally displaced second region 11 of the structure 10. Further, a RF/microwave/milli-meter wave transistor device formed in a laterally displaced third region 9 of the structure 10.

In particular, disposed over substrate 12 is a superlattice buffer layer 14 comprised of alternating layer pairs (not shown) of gallium arsenide and aluminum gallium arsenide (AlGaAs), each one of said layers having a typical thickness of 50-100 Angstroms disposed to provide a superlattice as is known in the art.

Disposed over superlattice layer 14 is an $In_xGa_{1-x}As$ channel layer 20 where x is typically between 0.1 and 0.4.

Disposed over channel layer 20 is a wide bandgap material aluminum gallium arsenide spacer layer 22, having a lower undoped spacer region, not shown, having a typical thickness of 30 Angstroms to 50 Angstroms and provides the charge donor region for the channel layer 20.

Disposed over layer 22 is an enhancement device etch stop layer, here N type conductivity Indium Gallium Phosphide (InGaP) layer 24. As will be described in more detail below, the layer 24 may be ZnSe. Is such embodiment, the ZnSe layer is grown on the AlGaAs layer 24 with MBE or MOCVD technology.

Layer 24 in addition to providing an etch stop layer also serves to provide a Schottky contact layer for an enhancement mode pHEMT device. Here, the InGaP layer composition is $In_{0.48}Ga_{0.52}P$. Such material has a bandgap voltage of 1.8 eV. It should be noted that breakdown voltage of the device will be increased by increasing the bandgap energy of the material in such layer 24. This bandgap energy will be increased by increasing the mole fraction of the Ga to a number greater than 0.52 i.e. to, for example, 0.7 providing a bandgap voltage of greater than 2.0 eV. Also the layer 24 may be of other materials such as ZnSe which provides a bandgap voltage of 2.6 eV. Thus, the RF/microwave/milli-meter wave transistor being formed will have a greater breakdown voltage enabling it to operate with higher powers of amplification.

Disposed on the InGaP or ZnSe layer 24 is an N type conductivity type AlGaAs depletion mode transistor device Schottky contact layer 26. The AlGaAs layer 26 is disposed on the InGaP or ZnSe layer 24. It should be noted that the AlGaAs layer 26 forms a composite Schottky contact layer with the InGaP or ZnSe layer 24.

Disposed on the AlGaAs layer 26 is an N type conductivity AlAs depletion mode transistor device etch stop layer 28. Disposed on the AlAs depletion mode transistor device etch stop layer 28 is a first N type conductivity GaAs layer 30. Disposed on the first GaAs layer 30 is an N type conductivity AlAs first recess etch stop layer 32. Disposed on the AlAs first recess etch stop layer 32 is a second N type conductivity GaAs layer 34.

Referring now to FIGS. 2-5 the method used to form the enhancement mode, depletion mode, and RF/microwave/milli-meter wave devices will be described.

A first mask (FIG. 2) 40 is provided with windows 42, 43 disposed over a portion of the first region 8 and third region 9 and a window 44 disposed over a portion of the second region 11. An etch, here citric acid, is brought into contact with portions on the structure exposed by the windows 42, 43, 44 to form a first recess 45 in the first region 8 and a first recess 47 in the second portion 11, and a third recess 49 of the structure 10, such recesses passing through the N type conductive GaAs layer 34 and the AlAs first recess etch stop layer 32 and terminating in the N type conductivity AlGaAs layer 30.

The first mask 40 is removed.

A second mask 50 (FIG. 3) is provided over the etched structure 10, such second mask 50 having windows 52, 53 disposed over the first recess 45 (FIG. 2) and the first recess 49 (FIG. 2), respectively, etched in the first region 8 and third region 9, respectively, of the structure 10, such second mask 50 masking the first recess 47 (FIG. 2) formed in the second region 11 of the structure 10.

An etch, here citric acid, is brought into contact with portions first recess 45 and the first recess 49 etched in the first region 8 and third region 9, respectively, of the structure 10 to extend such first recess 45 and first recess 49 into the first GaAs layer and then into the AlAs layer and terminating on the AlGaAs layer 30. Thus, the recesses in region 8 and region 9 include a lower narrow portion (i.e., recesses 45', 49' of FIG. 3) in layers 28 and 30 and an upper wider portion (i.e., recess 45, 49, respectively (FIG. 2) in layers 32 and 34). Here, the bottom of recess in the third region 9 provides a gate length of 0.5 micron or less because the transistor device to be formed in region 9 operates in the RF/microwave/milli-meter wave or millimeter wavelength range.

The second mask 50 is removed.

A third mask 60 (FIG. 4) is provided over the etched structure, such third mask 60 having a window 62 disposed over the first recess 47 etched in the second region 11 of the structure 10, such third mask 60 masking the recesses 45', 49; (FIGS. 2 and 3) formed in the first region 8 of the structure 10.

An etch, here citric acid, is brought into contact with portions first recess 47 etched in the second region 11 of the structure 10 to extend such first recess 47 into a second, narrow recess 53 formed in the first N type conductivity GaAs layer 30, then into the AlAs layer 28, then into the N type conductivity AlGaAs layer and into the N type conductivity type, InGaP enhancement mode device etch stop layer and Schottky contact layer 24.

Figure 5:
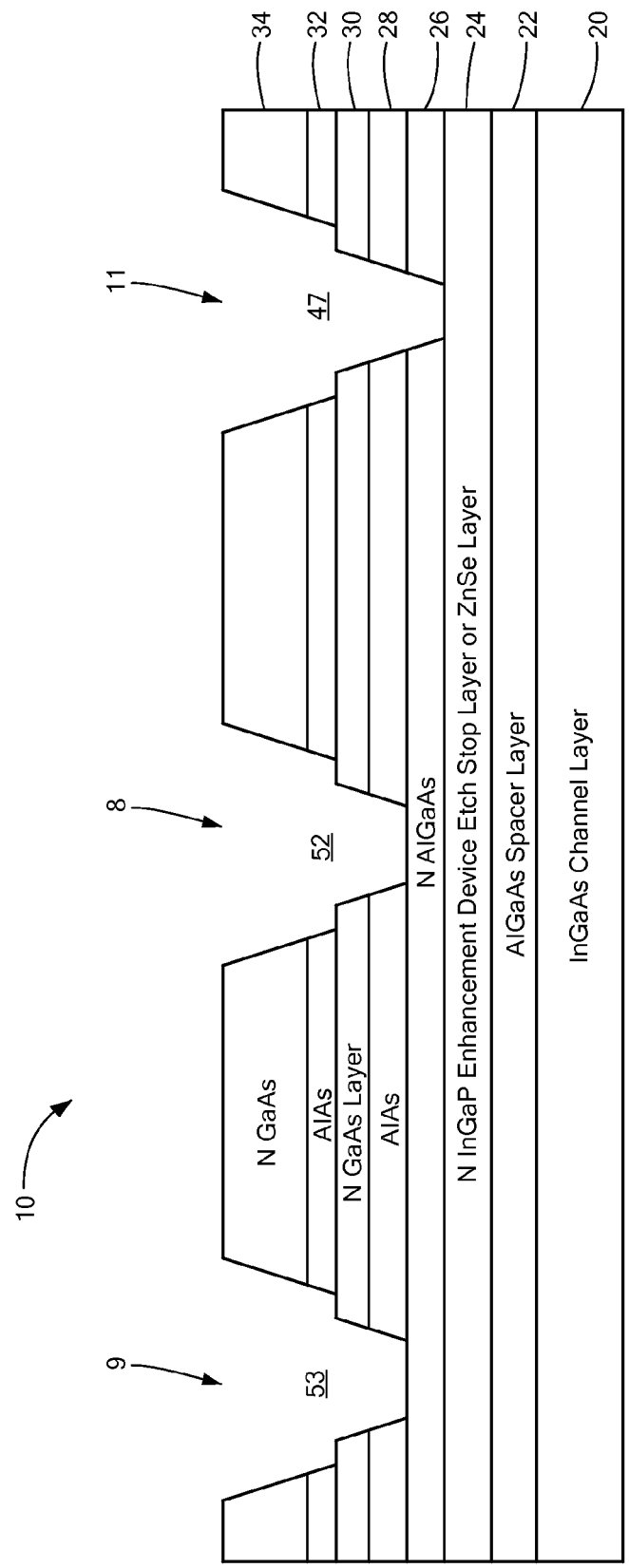

The mask 60 is removed producing the structure shown in FIG. 5.

Figure 6:
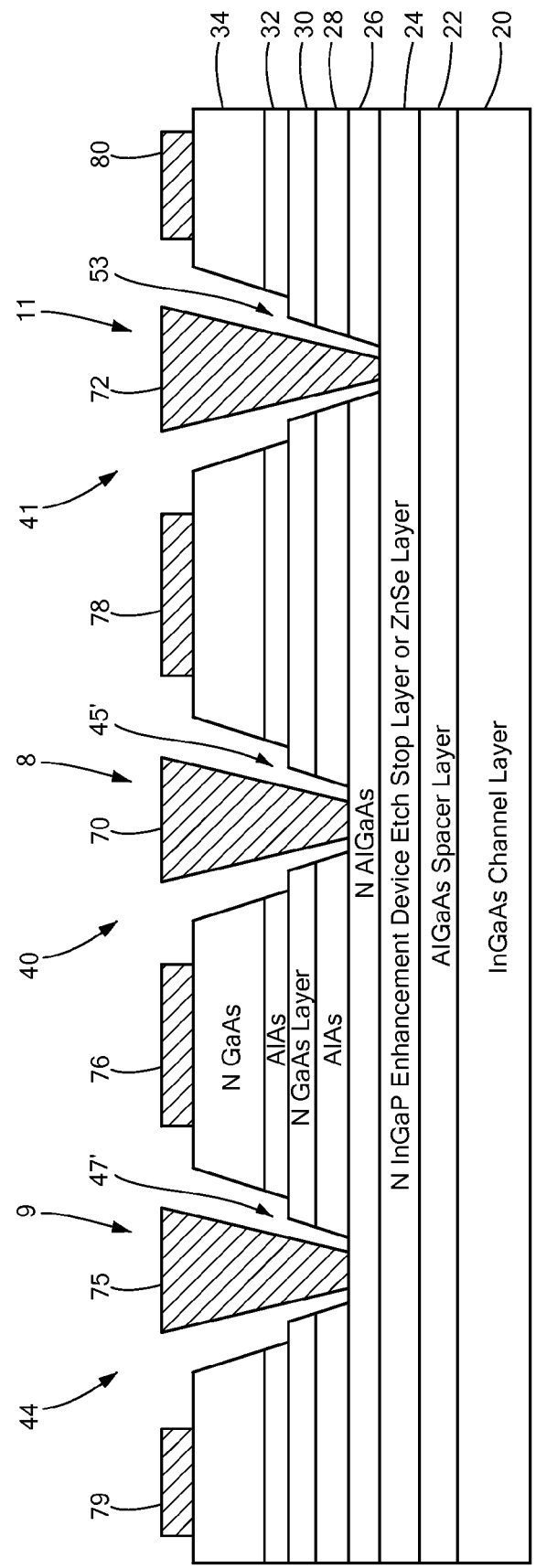

Referring to FIG. 6, a gate electrode 70 is formed in Schottky contact with the AlGaAs layer 26 terminating the second recess 45' formed in the first region 8 and a gate electrode 72 is formed in Schottky contact with the InGaP layer 24 terminating the second recess formed in the second region 11, and a gate electrode 75 is formed in Schottky contact with the AlGaAs layer 26 terminating the second recess 47' formed in the third region 9.

Source and drain electrodes 76, 78, 79 and 80 for the transistor devices are formed in regions 8, 9, and 11.

It is noted that, the depletion mode field effect transistor (FET) device 40 formed in region 8 has a gate recess having a wide portion passing through the second GaAs layer 34 and the AlAs first recess etch stop layer 32 and terminating in a narrow portion. The narrow portion passes through the first GaAs layer 30 and the AlAs depletion mode transistor device etch stop layer 28 and terminates in the AlGaAs layer 26.

The enhancement mode field effect transistor (FET) device 41 in region 11 has a gate recess having a wide portion passing through the second GaAs layer 34, the AlAs first recess etch stop layer 32 and terminating in a narrow portion. The narrow portion passes through the first GaAs layer 30, the AlAs depletion mode transistor device etch stop layer 28, the AlGaAs layer 26, and terminating in the InGaP layer 24.

The depletion mode transistor device 40 includes a gate electrode 70 in Schottky contact with the AlGaAs layer 26 and the enhancement mode device 41 includes a gate electrode 72 in Schottky contact with the InGaP layer 24. Source and drain electrodes 76, 78 and 80 for the transistor devices 40, 41 are in ohmic contact with the second GaAs layer 36.

It is noted that, the RF/microwave/milli-meter wave field effect transistor (FET) device 44 formed in region 11 has a gate recess having a wide portion passing through the second GaAs layer 34 and the AlAs first recess etch stop layer 32 and terminating in a narrow portion. The narrow portion passes through the first GaAs layer 30 and the AlAs depletion mode transistor device etch stop layer 28 and terminates in the AlGaAs layer 26.

The introduction of the InGaP or ZnSe layer 24 has been found by the inventors to add a positive impact to the RF/microwave/milli-meter wave performances pHEMT because of the higher breakdown voltage associated with the higher bandgap energy of the InGaP or ZnSe compared with that of AlGaAs. The bandgap energy of AlGaAs with 23 percent aluminum mole fraction is 1.6 eV. However, the InGaP with 48 percent indium has the bandgap energy of 1.8e InGaP or ZnSe layer 24. The bandgap energy of InGaP continues increasing by reducing the indium mole fraction and at the same time increasing the gallium mole fraction. Therefore, the Schottky contact made as a composite layer of AlGaAs layer 26 and InGaP or ZnSe layer 24 provides the advantage that the AlGaAs layer 26 is used as a stable Schottky layer while the higher bandgap materials of InGaP or ZnSe used for layer 24 are suitable to sustain high electric fields. This higher breakdown voltage means the better RF/microwave/milli-meter wave performance.

A number of embodiments of the invention have been described. Nevertheless, it will be understood that various modifications may be made without departing from the spirit and scope of the invention. Accordingly, other embodiments are within the scope of the following claims.

What is claimed is:

1. A semiconductor structure, comprising:
a III-V substrate structure with an enhancement mode transistor device disposed in a first region of the structure and depletion mode transistor device disposed in a laterally displaced second region of the structure and a RF/microwave/milli-meter wave transistor device formed in a laterally displaced third region of the structure;
a channel layer disposed in the substrate structure for the depletion mode and enhancement mode transistor devices;
wherein substrate structure includes:
an enhancement mode transistor device layer providing an etch stop layer also serving to provide a Schottky contact layer, such layer being disposed over the channel layer;
a first layer disposed on the enhancement mode transistor device layer;
a depletion mode transistor device etch stop layer disposed on the first layer; and
a second layer disposed on the depletion mode transistor device etch stop layer; and
wherein:
the depletion mode transistor device has a gate recess passing through the second layer and the depletion mode transistor device etch stop layer and terminating on the first layer;
the enhancement mode transistor device has a gate recess passing through the second layer, the depletion mode transistor device etch stop layer, the first layer, and terminating in the enhancement mode transistor device layer; and
the RF/microwave/milli-meter wave transistor has a gate recess passing through the second layer and the depletion mode transistor device etch stop layer and terminating on the first layer.

2. The semiconductor structure recited in claim 1 including a spacer layer disposed between the channel layer and the enhancement mode transistor device layer.

3. The semiconductor structure recited in claim 1 wherein the material of the first layer is different from the enhancement mode transistor device layer.

4. The semiconductor structure recited in claim 3 wherein the enhancement mode transistor device layer is InGaP or ZnSe.

5. The semiconductor structure recited in claim 4 wherein the the enhancement mode transistor device layer has a bandgap voltage of at least 1.8 ev.

6. A semiconductor structure, comprising:
a III-V substrate structure with an enhancement mode transistor device disposed in a first region of the structure and depletion mode transistor device disposed in a laterally displaced second region of the structure and a RF/microwave/milli-meter wave transistor device formed in a laterally displaced third region of the structure;
a channel layer disposed in the substrate structure for the depletion mode and enhancement mode transistor devices;
wherein substrate structure includes:
an enhancement mode transistor device layer providing an etch stop layer also serving to provide a Schottky contact layer, such layer being disposed over the channel layer, such enhancement mode transistor device layer having a bandgap voltage of at least 1.8 ev;
a first layer disposed on the layer providing an etch stop layer also serving to provide a Schottky contact layer;
a depletion mode transistor device etch stop layer disposed on the first layer;
and a second layer disposed on the depletion mode transistor device etch stop layer; and
wherein:
the depletion mode transistor device has a gate recess passing through the second layer and the depletion mode transistor device etch stop layer and terminating on the first layer;
the enhancement mode transistor device has a gate recess passing through the second layer, the depletion mode transistor device etch stop layer, the first layer, and terminating in the enhancement mode transistor device layer having a bandgap voltage of at least 1.8 ev; and
the RF/microwave/milli-meter wave transistor has a gate recess passing through the second layer and the depletion mode transistor device etch stop layer and terminating on the first layer.

7. The semiconductor structure recite in claim 6 including a spacer layer disposed between the channel layer and the layer providing an etch stop layer also serving to provide a Schottky contact layer, such spacer layer being a material different from the channel layer and the layer providing an etch stop layer also serving to provide a Schottky contact layer.

8. The semiconductor structure recited in claim 7 wherein the layer providing an etch stop layer also serving to provide a Schottky contact layer is ZnSe.

9. The semiconductor structure recited in claim 7 wherein the layer providing an etch stop layer also serving to provide a Schottky contact layer has a bandgap of at least 2.4 ev.

10. The semiconductor structure recited in claim 7 wherein the layer providing an etch stop layer also serving to provide a Schottky contact layer is InGaP.

11. The semiconductor structure recited in claim 10 wherein the InGaP layer providing an etch stop layer also serving to provide a Schottky contact layer is $In_{0.48}Ga_{0.52}P$.

* * * * *